(12) United States Patent
Sawada et al.

(10) Patent No.: US 10,327,328 B2
(45) Date of Patent: Jun. 18, 2019

(54) PRINTED CIRCUIT BOARD

(71) Applicant: FANUC CORPORATION, Yamanashi (JP)

(72) Inventors: Takeshi Sawada, Yamanashi (JP); Yuichi Okochi, Yamanashi (JP); Norihiro Saido, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/693,523

(22) Filed: Sep. 1, 2017

(65) Prior Publication Data

US 2018/0070442 A1  Mar. 8, 2018

(30) Foreign Application Priority Data

Sep. 7, 2016 (JP) ................................. 2016-174973

(51) Int. Cl.
*H05K 1/11* (2006.01)
*H05K 1/14* (2006.01)
(Continued)

(52) U.S. Cl.
CPC ......... *H05K 1/0268* (2013.01); *G01R 31/021* (2013.01); *H05K 1/141* (2013.01);
(Continued)

(58) Field of Classification Search
CPC .... G01R 31/021; H05K 1/0268; H05K 1/141; H05K 2201/0302; H05K 3/321; H05K 3/3436
See application file for complete search history.

(56) References Cited

U.S. PATENT DOCUMENTS 9,291,543 B1   3/2016 Robinson et al.
2013/0223836 A1*  8/2013 Gibbs ...................... H01Q 9/42
                                                              396/535

FOREIGN PATENT DOCUMENTS

JP       10062476 A   *   3/1998
JP       H10-062476 A     3/1998
(Continued)

OTHER PUBLICATIONS

Non Patent Literature used by the Examiner, JPN 6018023519; p. 1143, lines 7-10 of Cited Document 3; with partial English Translation (mark in red).

(Continued)

*Primary Examiner* — Yuriy Semenenko
(74) *Attorney, Agent, or Firm* — Studebaker & Brackett PC

(57) ABSTRACT

To provide a printed circuit board that allows for easy exchange of only a deterioration detection conductor, and can reduce costs. A printed circuit board includes: a main printed circuit board in which a wiring pattern is formed on an insulated substrate; and a deterioration detection wiring board in which deterioration detection wiring (deterioration detection wiring pattern) which is wiring having a form whereby deterioration is promoted compared to the wiring pattern on the insulated substrate is formed on a separate insulated substrate from the main printed circuit board, and is exchangeably connected to the main printed circuit board in a vicinity thereof by way of a replacement-enabling connection part. One mode of the replacement-enabling connection part of the printed circuit board is a connection part (solder joint) constituted by solder, another mode thereof is a connection part (electrically conductive adhesive connection part) constituted by electrically conductive adhesive, and yet another mode thereof is a connection part (cable) constituted by a cable.

25 Claims, 12 Drawing Sheets

(51) Int. Cl.
*H05K 1/02* (2006.01)
*G01R 31/02* (2006.01)
*H05K 3/32* (2006.01)
*H05K 3/34* (2006.01)

(52) U.S. Cl.
CPC ........... *H05K 3/321* (2013.01); *H05K 3/3436* (2013.01); *H05K 2201/0302* (2013.01)

(56) References Cited

FOREIGN PATENT DOCUMENTS

| | | |
|---|---|---|
| JP | 2001-358429 A | 12/2001 |
| JP | 3952660 B2 | 8/2007 |
| JP | 2015-145864 A | 8/2015 |
| JP | 2016-115922 A | 6/2016 |
| WO | 2016/103503 A1 | 6/2016 |

OTHER PUBLICATIONS

An Office Action mailed by the Japanese Patent Office dated Jun. 26, 2018, which corresponds to Japanese Patent Application No. 2016-174973 and is related to U.S. Appl. No. 15/693,523; with partial English Translation.

A Decision of Refusal issued by the Japanese Patent Office and dated Mar. 5, 2019, which corresponds to Japanese Patent Application No. 2016-174973 and is related to U.S. Appl. No. 15/693,523; with English Translation.

\* cited by examiner

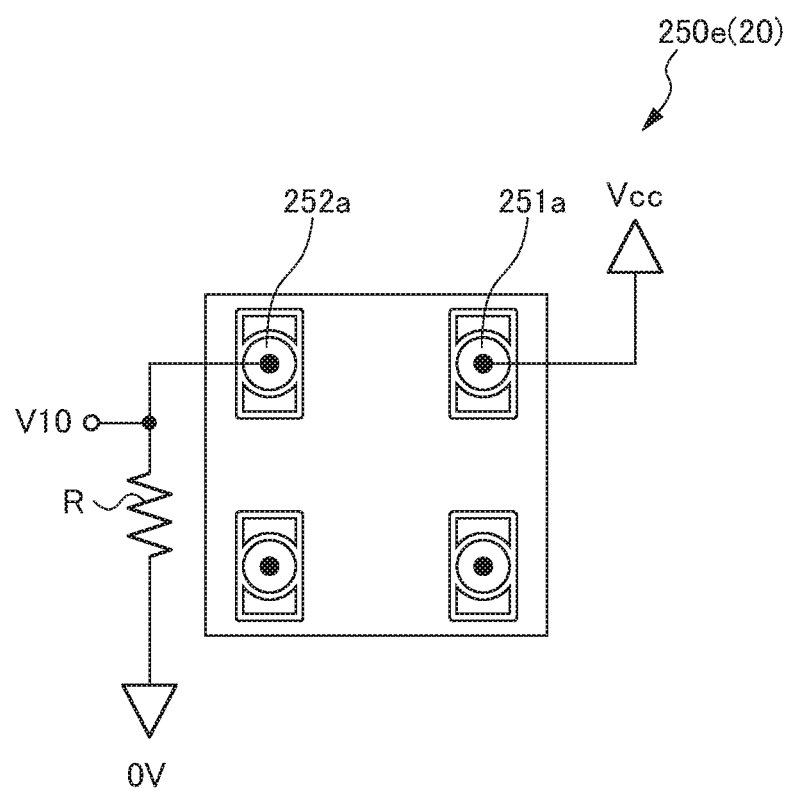

w > w1 h > h1

PRINTED CIRCUIT BOARD

This application is based on and claims the benefit of priority from Japanese Patent Application No. 2016-174973, filed on 7 Sep. 2016, the content of which is incorporated herein by reference.

BACKGROUND OF THE INVENTION

Field of the Invention

The present invention relates to a printed circuit board, and in more detail, to a printed circuit board equipped with a deterioration detection means.

Related Art

When the wiring pattern formed on a printed circuit board deteriorates due to corrosion or electrolytic corrosion, it leads to failure of electrical equipment or electronic equipment applying this printed circuit board. In order to prevent such failure, various techniques for detecting deterioration of a printed circuit board have been proposed. As one technique, there is a proposal of providing a conductor that functions for the main purpose of the printed circuit board, and a conductor for deterioration detection configured so as to narrow the width or narrow the insulation clearance compared to this conductor, whereby deterioration is promoted (for example, refer to Patent Document 1). With the proposal disclosed in Patent Document 1, by detecting the deterioration extent of the conductor for deterioration detection, it tries to establish a countermeasure by predicting the progression of deterioration of the conductor functioning for the primary purpose of use at an early stage.

In addition, as another of the same type of technique, there is a proposal of printing a deterioration detection conductor separately from the conductor constituting the electrical circuits on the same printed circuit board, and conducting solder resist that is thinner than normal in particular to form a deterioration detection conductor (for example, refer to Patent Document 2). Furthermore, there is also a proposal of configuring so as to expose (not provide solder resist) the conductor of a deterioration detection conductor on the aforementioned same such printed circuit board (for example, refer to Patent Document 3).

Patent Document 1: Japanese Patent No. 3952660
Patent Document 2: Japanese Unexamined Patent Application, Publication No. 2001-358429
Patent Document 3: Japanese Unexamined Patent Application, Publication No. H10-62476

SUMMARY OF THE INVENTION

However, when forming a conductor functioning for the primary purpose, and a conductor for deterioration detection having a narrower width than this or narrower insulation clearance on the same printed circuit board as in the technology disclosed in Patent Document, the yield rate in the printed circuit board manufacturing process declines and the cost increases. In addition, in the case of thinly forming a part of the solder resist on the same printed circuit board as in the technology disclosed in Patent Document 2, complication of the manufacturing process is unavoidable. This point similarly applies also in the technology disclosed in Patent Document 3.

For any of the proposals in Patent Documents 1 to 3, if deterioration of the deterioration detection conductor progresses, it will no longer be able to function for detection of deterioration. In the case of reaching such a state, if the deterioration detection conductor is formed on the same printed circuit board as the conductor of the primary circuit functioning as the product, it will be difficult to replace only the deterioration detection conductor.

The present invention has been made taking into account the above such situation, and has an object of providing a printed circuit board that allows for easy exchange of only a deterioration detection conductor, and can reduce costs.

Accord to the present invention, a printed circuit board (e.g., the printed circuit board 1 described later) includes: a main printed circuit board (e.g., the main printed circuit board 10 described later) in which a wiring pattern is formed on an insulated substrate; and a deterioration detection wiring board (e.g., the deterioration detection wiring board 20 described later) in which deterioration detection wiring (e.g., the deterioration detection wiring pattern 25 described later) which is wiring having a form whereby deterioration is promoted compared to the wiring pattern is formed on a separate insulated substrate from the main printed circuit board, and is exchangeably connected to the main printed circuit board in a vicinity thereof by way of a replacement-enabling connection part (e.g., the replacement-enabling connection part 30 described later).

According to a first aspect of the present invention, in the printed circuit board of one aspect, the replacement-enabling connection part is a connection part (e.g., the solder joint 31 described later) configured by solder.

According to a second aspect of the present invention, in the printed circuit board as described in the first aspect, the replacement-enabling connection part is a connection part (e.g., the electrically conductive adhesive connection part 32 described later) configured by an electrically conductive adhesive.

According to a third aspect of the present invention, in the printed circuit board as described in the first aspect, the replacement-enabling connection part is a connection part (e.g., the cable 33 described later) configured by a cable.

According to a fourth aspect of the present invention, in the printed circuit board as described in the first aspect, the replacement-enabling connection part is a connection part configured by a latch-type fitting component such as a connector.

According to the present invention, it is possible to realize a printed circuit board that allows for easy exchange of only a deterioration detection conductor, and can reduce costs.

BRIEF DESCRIPTION OF THE DRAWINGS

FIG. 10B is an another view showing yet another example of a deterioration detection wiring board of the printed circuit board of FIG. 1;

DETAILED DESCRIPTION OF THE INVENTION

Figure 1:
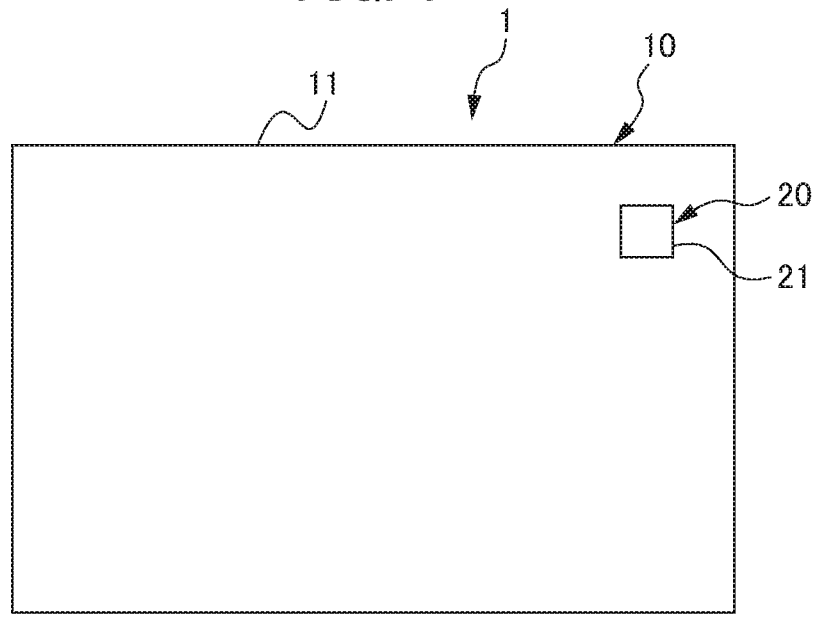
FIG. 1 is a plan view showing a printed circuit board as an embodiment of the present invention.

FIG. 1 is an outline block diagram showing a printed circuit board as an embodiment of the present invention. A printed circuit board 1 includes a main printed circuit board 10 in which a wiring pattern (not illustrated) is formed on an insulated substrate 11, and a deterioration detection wiring board 20 which is exchangeably connected by a replacement-enabling connection part (covered and not shown at bottom side in FIG. 1) to a vicinity of the printed circuit board 10. On the deterioration detection wiring board 20, a deterioration detection wiring pattern which is wiring having the form for which deterioration is promoted compared to the wiring pattern of the main printed circuit board 10, is formed on the insulated substrate 21 which is separate from the main printed circuit board 10. The deterioration detection wiring board 20 will be explained by referencing the drawings later.

Figure 2:
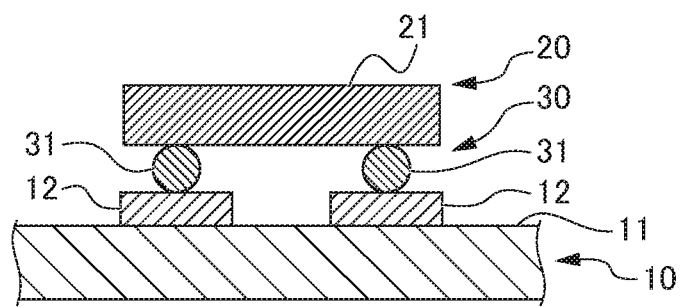
FIG. 2 is a lateral cross-sectional view showing an aspect of connection between a main printed circuit board and a deterioration detection wiring board on the printed circuit board of FIG. 1.

FIG. 2 is a lateral cross-sectional view showing an aspect of connection between the main printed circuit board and the deterioration detection wiring board of the printed circuit board in FIG. 1. In the connection mode of FIG. 2, a solder joint 31 as a replacement-enabling connection part 30 is provided between a pad part 12 of a conductor formed on the insulated substrate 11 of the main printed circuit board 10 and the deterioration detection wiring pattern formed on the insulated substrate 21 of the deterioration detection wiring board 20. The solder joint 31 connects the pad part 12 formed on the insulated substrate 11 of the main printed circuit board 10 and the deterioration detection wiring board 20 using the characteristics of solder in detachably connecting between conductors. In other words, the solder joint 31 constitutes a replacement-enabling connection part 30 that exchangeably connects the deterioration detection wiring board 20 to the vicinity of the main printed circuit board 10. Therefore, in the case of deterioration of the deterioration detection wiring board 20 progressing, it is possible to exchange with a new deterioration detection wiring board 20 easily by detaching the deterioration detection wiring board 20 from the main printed circuit board 10 at the replacement-enabling connection part 30 or at the site of the solder joint 31.

Figure 3:
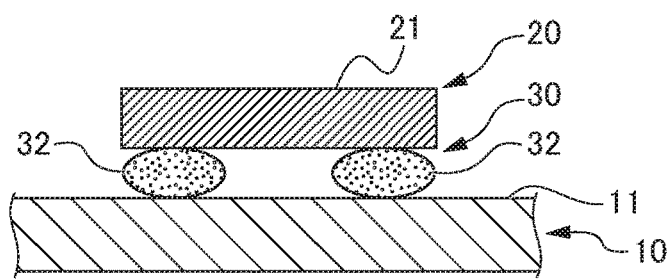
FIG. 3 is a lateral cross-sectional view showing another aspect of connection between a main printed circuit board and a deterioration detection wiring board on the printed circuit board of FIG. 1.

FIG. 3 is a cross-sectional view showing another aspect of connection between the main printed circuit board and the deterioration detection wiring board of the printed circuit board of FIG. 1. In the connection mode of FIG. 3, a conductive adhesive connection part 32 as the replacement-enabling connection part 30 is provided between the conductor (not illustrated) formed on the insulated substrate 11 of the main printed circuit board 10, and the deterioration detection wiring formed on the insulated substrate 21 of the deterioration detection wiring board 20. In other words, the conductive adhesive connection part 32 creates the replacement-enabling connection part 30 that adheres the conductor formed on the main printed circuit board 10 and the deterioration detection wiring formed on the deterioration detection wiring board 20. If the replacement-enabling connection part formed by the conductive adhesive is using a release agent, it is possible to separate the adhered portion. Therefore, in the case of deterioration of the deterioration detection wiring board 20 progressing, it is possible to exchange with a new deterioration detection wiring board 20 easily by detaching the deterioration detection wiring board 20 from the main printed circuit board 10 at the replacement-enabling connection part 30 or at the site of the conductive adhesive connection part 32.

Figure 4:
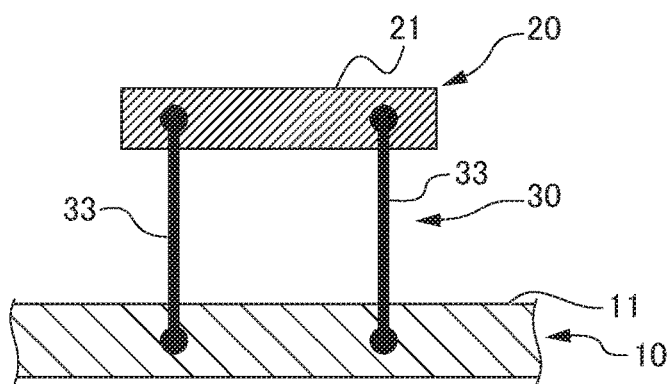
FIG. 4 is a schematic diagram showing yet another aspect of connection between a main printed circuit board and a deterioration detection wiring board on the printed circuit board of FIG. 1.

FIG. 4 is a cross-sectional view showing yet another aspect of connection between the main printed circuit board and the deterioration detection wiring board of the printed circuit board of FIG. 1. In the connection mode of FIG. 4, a cable 33 as the replacement-enabling connection part 30 is provided between the conductor formed on the insulated substrate 11 of the main printed circuit board 10, and the conductor formed so as to conduct with the deterioration detection wiring formed on the insulated substrate 21 of the deterioration detection wiring board 20. In other words, the cable 33 creates the replacement-enabling connection part 30 connecting the conductor formed on the main printed circuit board 10 and deterioration detection wiring of the deterioration detection wiring board 20 by way of a cable that can be cut and replaced at an appropriate site. Therefore, in the case of deterioration of the deterioration detection wiring board 20 progressing, it is possible to exchange with a new deterioration detection wiring board 20 easily, by separating the deterioration detection wiring board 20 from the main printed circuit board 10 at the site of the cable 33, which is the replacement-enabling connection part 30.

Three examples of the replacement-enabling connection part 30 which exchangeably connects the deterioration detection wiring board 20 to the main printed circuit board 10 have been explained above by referencing FIGS. 2 to 4. In other words, there is the case of constituting the replacement-enabling connection part 30 by solder (FIG. 2), the case of constituting by conductive adhesive (FIG. 3), and the case of constituting by a cable (FIG. 4). However, the configurational examples of the replacement-enabling connection part 30 are not limited thereto. In other words, the replacement-enabling connection part 30 may be configured to be constituted by a connector (not illustrated).

Figure 5:
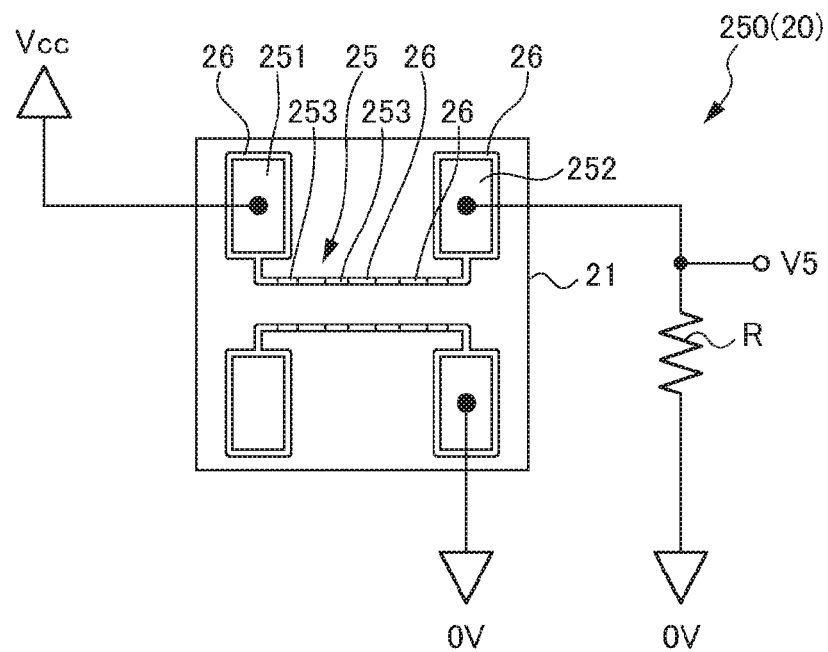
FIG. 5 is a view showing an example of a deterioration detection wiring board of the printed circuit board of FIG. 1.

Next, among the deterioration determination wiring board of the printed circuit board in FIG. 1, an example of using in wiring disconnect detection will be explained in sequence by referencing FIGS. 5 to 8. FIG. 5 is a view showing an example of a deterioration detection wiring board of the printed circuit board in FIG. 1. The deterioration detection wiring board 20 in FIG. 5 is applied to the presumption of wiring disconnect occurrence in the pattern interface of the main printed circuit board 10. The reference number 250 is assigned to this deterioration detection wiring board 20. In the deterioration detection wiring board 250, a deterioration detection wiring pattern 25 is formed on one principal surface of the insulated substrate 21 (in the present example, the bottom surface that is the opposing face to the main printed circuit board 10 in FIG. 1). As in the drawing, the deterioration detection wiring pattern 25 has one end side thereof extending to a first pad part 251, and the other end side extending to a second pad part 252. The deterioration detection wiring pattern 25 has a portion of the conductor spanning from the first pad part 251 to the second pad part 252 covered by solder resist 26; however, at a plurality of locations midway (four locations in the example of the drawing), deterioration promotion parts 253 at which the solder resist 26 is interrupted to expose to air are formed. In other words, at the deterioration promotion parts 253, deterioration is relatively fast due to being exposed to air, compared to the pad parts, etc. of the wiring pattern covered by the solder resist on the main printed circuit board 10 in FIG. 1. Therefore, by detecting this deterioration in the deterioration detection wiring board 250 at an early stage, the deterioration extent of the wiring pattern on the main printed circuit board 10 can be presumed (in this case, timing leading to wiring disconnect of the pattern interface occurring).

In the deterioration detection wiring board 250 of FIG. 5, a DC voltage Vcc for detection is applied to the first pad part 251, and the side of the second pad part 252 is grounded (0 V), as in the drawing. A resistor R for voltage detection is inserted between the second pad part 252 and ground. According to a voltage V5 detected from a terminal of the resistor R on the side of the second pad part 252, wiring disconnect of the deterioration detection wiring pattern 25 is detected. In other words, when the deterioration promotion part 253 of the deterioration detection wiring pattern 25 preferentially deteriorates to produce a wiring disconnect, the voltage V5 is approximately Vcc until immediately before this occurs, and then shifts to the ground potential (0 V). In the deterioration detection wiring board 250 of FIG. 5, since the wiring disconnect of the deterioration detection wiring pattern 25 is detected in advance of the circuit of the main printed circuit board 10 by configuring in this way, the wiring disconnect timing of the pattern interface of the main printed circuit board 10 is presumed based on the detection of wiring disconnect.

Figure 6:
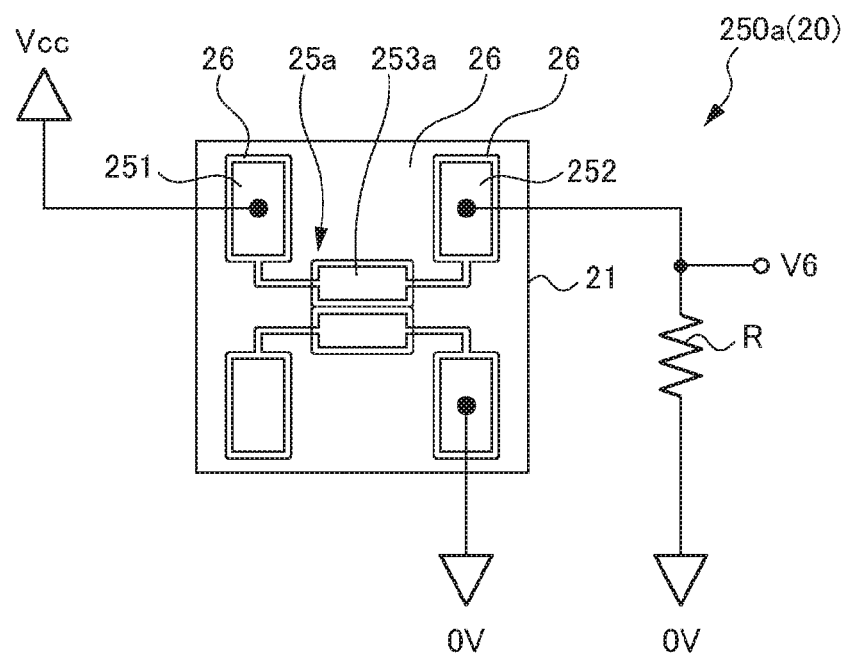
FIG. 6 is a view showing another example of a deterioration detection wiring board of the printed circuit board of FIG. 1.

FIG. 6 is a view showing another example of a deterioration detection wiring board of the printed circuit board in FIG. 1. FIG. 6 is illustrated with the same reference numbers being assigned to corresponding parts with previously described FIG. 5, and explanations of these respective parts are omitted as appropriate. The deterioration detection wiring board of FIG. 6 is applied to the presumption of wiring disconnect of the pattern interface of the main printed circuit board 10, similarly to that in the example of FIG. 5, and the reference number 250a is assigned thereto. The deterioration detection wiring board 250a of FIG. 6 shares most portions with the deterioration detection wiring board 250 of FIG. 5. On the other hand, both differ in regards to the form of the deterioration promotion part 253a (253 in FIG. 5). In the deterioration promotion part 253 in the deterioration detection wiring pattern 25 of FIG. 5, the conductor spanning from the first pad part 251 to the second pad part 252 is a form exposed to air at a plurality of locations midway by the solder resist 26 being interrupted. Compared to this, in the deterioration promotion part 253a of the deterioration detection wiring pattern 25a in the example of FIG. 6, a form is made in which one place of a portion which widens in width midway is exposed to air over a relatively large area. For this reason, in the deterioration detection wiring board 250a of FIG. 6, deterioration is remarkably promoted compared to the deterioration detection wiring board 250 of FIG. 5, and early stage deterioration detection is possible. It should be noted that, also in the deterioration detection wiring board 250a of FIG. 6, the detection of wiring disconnect is based on the voltage V6 detected from the terminal of the resistor R on the side of the second pad part 252. The principle of detection is as previously described for the voltage V5 in FIG. 5.

Figure 7:
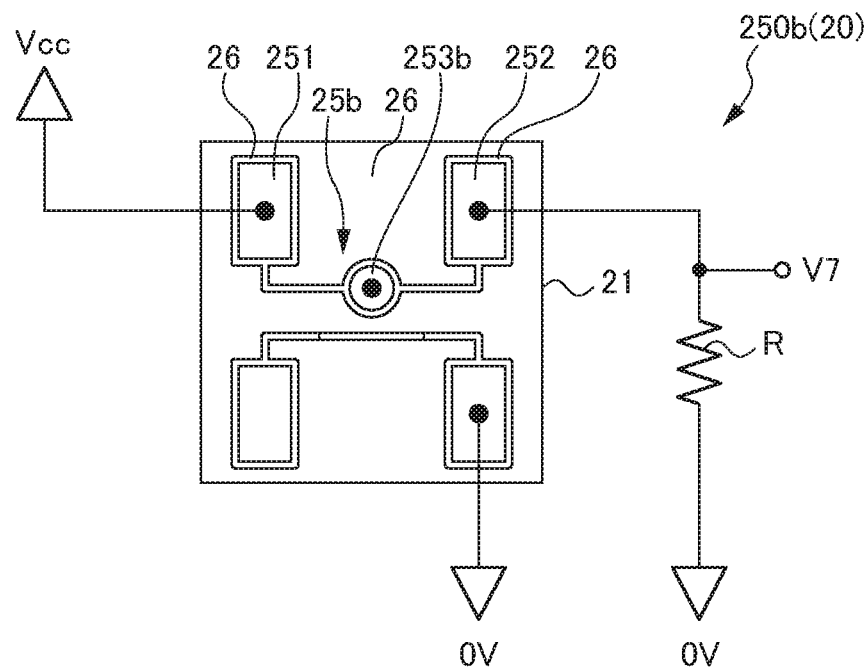
FIG. 7 is a view showing yet another example of a deterioration detection wiring board of the printed circuit board of FIG. 1.

FIG. 7 is a view showing yet another example of the deterioration detection wiring board of the printed circuit board in FIG. 1. FIG. 7 is illustrated by assigning the same reference numbers to corresponding parts with the previously described FIG. 5, and explanations of each of these parts will be omitted as appropriate. For the deterioration detection wiring board of FIG. 7, that in the example of FIG. 5 is applied to the presumption of wiring disconnect at the pattern interface of the main printed circuit board 10; whereas, the example of FIG. 7 is applied to the presumption of wiring disconnect of a via, and the reference number 250b is assigned thereto.

The deterioration detection wiring board 250b of FIG. 7 shares most portions with the deterioration detection wiring board 250 of FIG. 5. On the other hand, the point of difference between the two is that, the deterioration detection wiring pattern 25 in the example of FIG. 5 is in the form exposing to air by the solder resist 26 being interrupted at a plurality of locations midway in the conductor spanning from the first pad part 251 to the second pad part 252; whereas, in the deterioration detection wiring pattern 25b in the example of FIG. 7, a form is made in which, at one place of the portion 253b approaching a via midway, a portion exhibiting a ring shape surrounding the via is relative large area and exposed to air. For this reason, in the deterioration detection wiring board 250b of FIG. 7, compared to the deterioration detection wiring board 250 of FIG. 5, deterioration is remarkably promoted at the ring-shaped portion surrounding the via, whereby early stage deterioration detection is possible. It should be noted that, also in the deterioration detection wiring board 250b of FIG. 7, the detection of wiring disconnect is based on the voltage V7 detected from the terminal of the resistor R on the side of the second pad part 252. The principle of detection is as previously described for the voltage V5 in FIG. 5.

Figure 8:
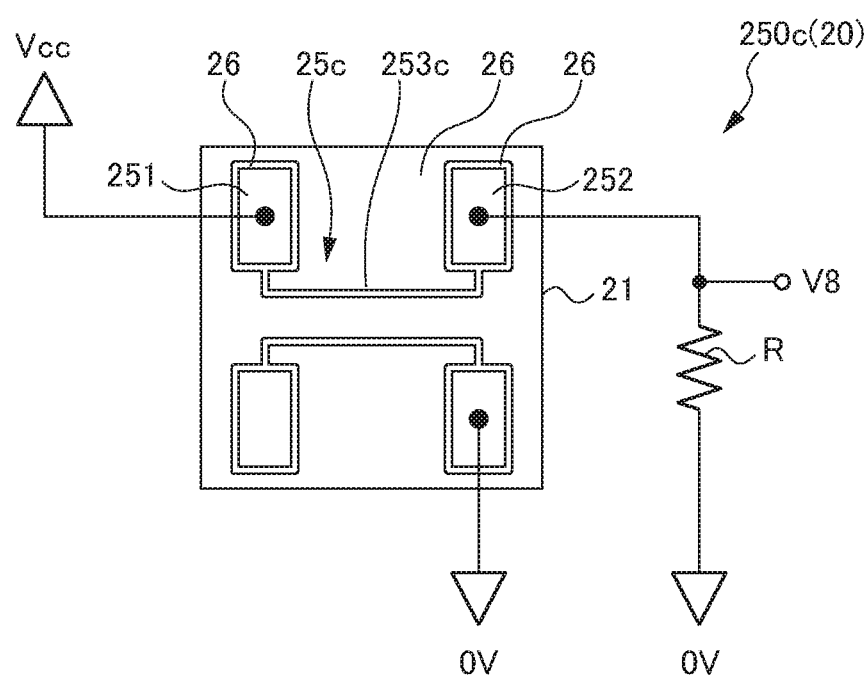
FIG. 8 is a view showing yet another example of a deterioration detection wiring board of the printed circuit board of FIG. 1.

FIG. 8 is a view showing yet another example of the deterioration detection wiring board of the printed circuit board in FIG. 1. FIG. 8 is illustrated with the same reference numbers being assigned to corresponding parts with previously described FIG. 5, and explanations of these respective parts are omitted as appropriate. For the deterioration detection wiring board of FIG. 8, that in the example of FIG. 5 is applied to the presumption of wiring disconnect at the pattern interface of the main printed circuit board 10; whereas, that of FIG. 8 is applied to the presumption of wiring disconnect at the site of a shoulder part of a solder resist covered pattern, and the reference number 250c is assigned thereto. The deterioration detection wiring board 250c of FIG. 8 shares most portions with the deterioration detection wiring board 250 of FIG. 5. On the other hand, both differ in regards to the deterioration detection wiring pattern 25c (25 in the example of FIG. 5). The deterioration detection wiring pattern 25 in the example of FIG. 5 is of a form exposing to air by the solder resist 26 being interrupted, at a plurality of locations midway of the conductor spanning from the first pad part 251 to the second pad part 252. Compared thereto, in the deterioration detection wiring pattern 25c in the example of FIG. 8, a form is made in which the solder resist covered part is not interrupted midway, and is covered entirely from one end to the other end.

The deterioration detection wiring board 250c of FIG. 8 resembles the sites at the top shoulder of the solder resist covered pattern on the main printed circuit board 10 of FIG. 1. In other words, it creates a conductor portion in which the wiring width is relatively narrow. For this reason, compared to the main printed circuit board 10, early stage deterioration detection is possible for the above-mentioned narrow conductor portion. It should be noted that, also in the deterioration detection wiring board 250c of FIG. 8, the detection of wiring disconnect is based on the voltage V8 detected from the terminal of the resistor R on the side of the second pad part 252. The principle of detection is as previously described for the voltage V5 in FIG. 5.

Figure 9:
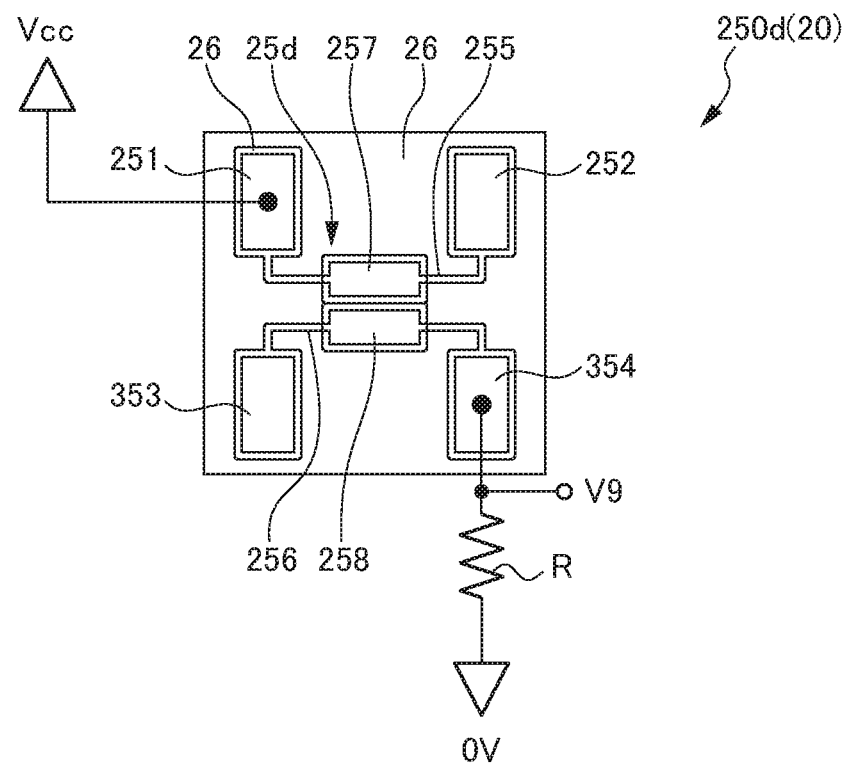
FIG. 9 is a view showing yet another example of a deterioration detection wiring board of the printed circuit board of FIG. 1.

Next, among the deterioration detection wiring boards of the printed circuit board in FIG. 1, an example of one used in leak detection will be explained in sequence by referencing FIG. 9. FIG. 9 is a view showing yet another example of the deterioration detection wiring board of the printed circuit board in FIG. 1. The example of FIG. 9 is applied to the presumption of leak (insulation degradation) of the main printed circuit board 10, and the reference number 250d is assigned thereto.

In the deterioration detection wiring board 250d, the deterioration detection wiring pattern 25d is formed on one principal surface of the insulated substrate 21 (in the present example, bottom surface which is the opposing face to the main printed circuit board 10 in FIG. 1). As in the drawing, the deterioration detection wiring pattern 25d includes a first conductor portion 255 and second conductor portion 256, which are two conductor portions parallel to horizontal in FIG. 9. One end side of the first conductor portion 255 extends to the first pad part 251, and the other end side extends to the second pad part 252. Similarly, one end side of the second conductor portion 256 extends to the third pad part 353, and the other end side extends to the fourth pad part 354. At one place of a portion which widens in width at an intermediate position of the first conductor portion 255, a first insulation degradation promotion part 257 is formed. The first insulation degradation promotion part 257 creates a form in which the conductor is exposed to air by the solder resist being interrupted over a relatively large area. Similarly, at a place of a portion that widens in width at an intermediate portion of the second conductor portion 256, the second insulation degradation promotion part 258 is formed. The second insulation degradation promotion part 258 creates a form in which the conductor is exposed to air by the solder resist being interrupted over a relatively large area.

Between the first insulation degradation promotion part 257 and second insulation degradation promotion part 258 formed in the above way is exposed to air, and thus insulation degradation between these two is relatively faster than other circuits. The insulation degradation is detected by way of leak detection between the first insulation degradation promotion part 257 and second insulation degradation promotion part 258. Therefore, by detecting this insulation degradation at an early stage in the deterioration detection wiring board 250d, it becomes possible to estimate the insulation degradation extent of the wiring pattern on the main printed circuit board 10 (in this case, timing leading to insulation between conductors deteriorating and leak current arising).

In the deterioration detection wiring board 250d of FIG. 9, the DC voltage Vcc for detection is applied to the first pad part 251, and the side of the fourth pad part 354 is grounded (0 V), as in the drawings. The resistor R for voltage detection is inserted between the fourth pad part 354 and the ground. The insulation degradation is detected according to the voltage V9 detected from the terminal of the resistor R on the side of the fourth pad part 354. In other words, the insulation between the first insulation degradation promotion part 257 and the second insulation degradation promotion part 258 of the deterioration detection wiring pattern 25d preferentially deteriorates, and when the leak of current occurs, the voltage V9 until immediately before this occurs is approximately 0 V, and shifts to Vcc. In the deterioration detection wiring board 250d of FIG. 9, the leak of current (insulation degradation) at the deterioration detection wiring pattern 25d is detected in advance earlier than the main printed circuit board 10 by configuring in this way; therefore, insulation degradation of the main printed circuit board 10 is presumed based on the detection of leak current.

Figure 10A:
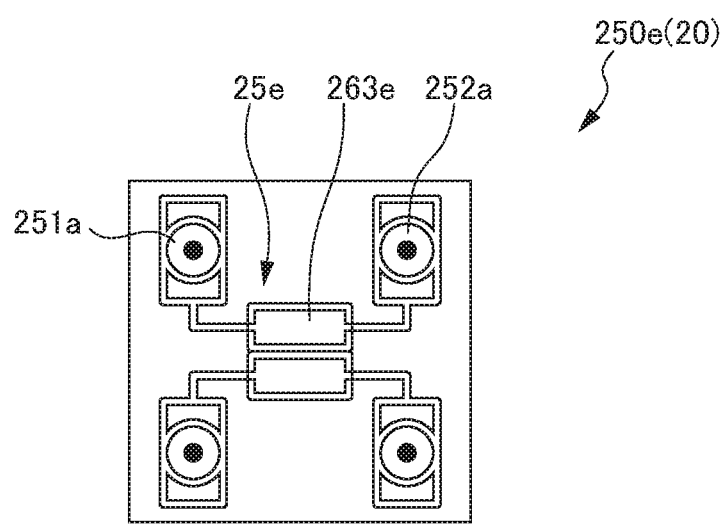
FIG. 10A is a view showing yet another example of a deterioration detection wiring board of the printed circuit board of FIG. 1.

Next, among the deterioration detection wiring boards of the printed circuit board in FIG. 1, another example thereof used in wiring disconnect detection will be explained by referencing FIG. 10A and FIG. 10B. FIG. 10A and FIG. 10B is a view showing yet another example of a deterioration detection wiring board of the printed circuit board in FIG. 1. FIG. 10A representing the wiring pattern on one principal surface (top side) that is the opposite side to the opposing face to the printed circuit board 10 of the deterioration detection wiring board. FIG. 10B representing the wiring pattern on the other principal surface (bottom side) that is the opposing face to the printed circuit board 10 of the deterioration detection wiring board. The deterioration detection wiring board 20 of FIG. 10A and FIG. 10B is another embodiment applied to the presumption of wiring disconnect in the main printed circuit board 10, and the reference number 250e is assigned thereto. As in the drawing, the wiring pattern of FIG. 10A resembles that of previously described FIG. 6. The deterioration detection wiring pattern 25e is formed on one principal surface (top side) of the deterioration detection wiring board 250e. As in the drawing, the deterioration detection wiring pattern 250e has one end side thereof extending to the first pad part 251a, and the other end side extending to the second pad part 252a.

As is easily understood by comparing FIG. 10A and FIG. 10B, the first pad part 251a and second pad part 252a on the top side shown in FIG. 10A are a pad-on-through-via (it may not be pad-on-through-via, but rather arrange the through-via in the vicinity of the pad, and connect the pad and through via), and when inverting the deterioration detection wiring board 250e, the first pad part 251a and second pad part 252a are positioned as separated conductors the same as the bottom side shown in FIG. 10B. In FIG. 10A, the deterioration detection wiring pattern 25e creates a form exposing to air over a relatively large area at one place of a portion that widens in width midway of the conductor spanning from the first pad part 251a to the second pad part 252a. This portion exposed to air is the deterioration promotion part 263e, and deterioration is promoted thereat. Therefore, by detecting this deterioration in the deterioration detection wiring board 250e at an early stage, it becomes possible to presume the deterioration extent of the wiring pattern on the main printed circuit board 10 (in this case, timing leading to wiring disconnect of the pattern interface occurring).

In the deterioration detection wiring board 250e of FIG. 10A and FIG. 10B, at the bottom side shown in FIG. 10B, the DC voltage Vcc for detection is applied to the first pad part 251a, and the side of the second pad part 252a is grounded (0 V). The resistor R for voltage detection is inserted between the second pad part 252a and ground. According to the voltage V10 detected from the terminal of the resistor R on the side of the second pad part 252a, wiring disconnect of the deterioration detection wiring pattern 25e is detected. In other words, when the deterioration promotion part 263e of the deterioration detection wiring pattern 25e preferentially deteriorates to produce a wiring disconnect, the voltage V10 is approximately Vcc until immediately before this occurs, and then shifts to the ground potential (0 V). At the deterioration detection wiring board 250e in FIG. 10A and FIG. 10B, since the wiring disconnect of the deterioration detection wiring pattern 25 is detected in advance of the circuit of the main printed circuit board 10 by configuring in this way, the wiring disconnect timing of the pattern interface of the main printed circuit board 10 is presumed based on the detection of wiring disconnect.

Figure 11A:
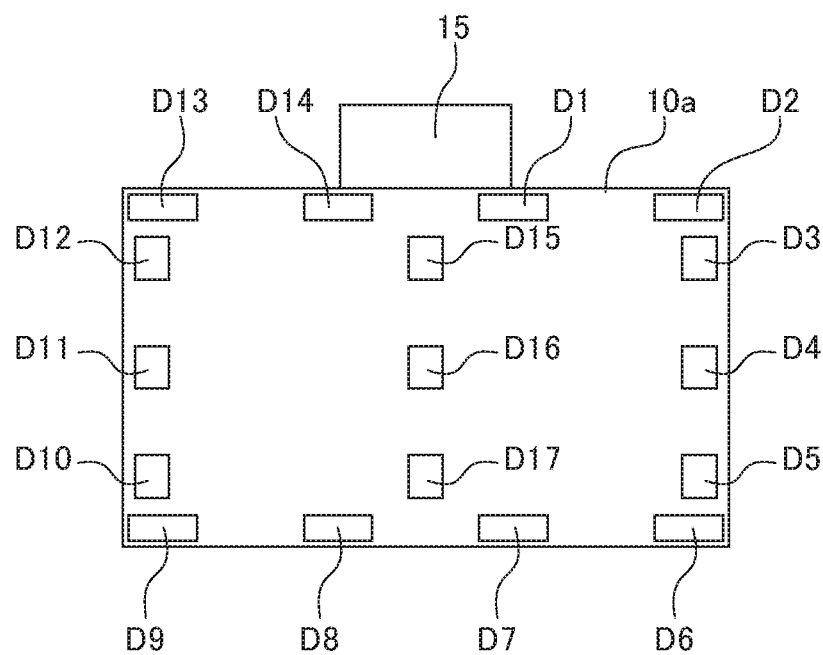
FIG. 11A is a plan view showing a modified example related to the printed circuit board of FIG. 1.
Figure 11B:
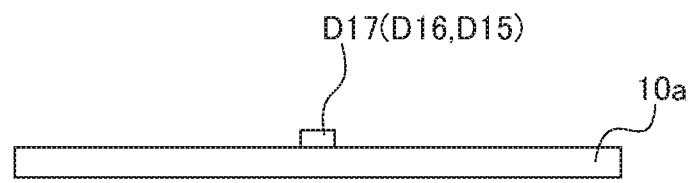
FIG. 11B is a front view focusing on a part of components of the modified example related to the printed circuit board of FIG. 1.

FIG. 11A is a plan view showing a modified example related to the printed circuit board of FIG. 1. FIG. 11B is a front view focusing on a part of components of the modified example related to the printed circuit board of FIG. 1. The printed circuit board as the aforementioned embodiment has built-in the deterioration detection wiring board 20 on the main printed circuit board 10; whereas, the main printed circuit board 10a in FIG. 11A and FIG. 11B has built-in a dummy component for deterioration estimation, in addition to functional elements arranged for the original purpose, in a component mounting region (one principal surface and/or the other principal surface).

In the example of FIG. 11A and FIG. 11B, particularly the dummy components D1 to D17 are arranged on the printed circuit board 10a in a region in which deterioration tends to advance. In other words, the dummy components D1 to D14 are arranged in a region of a circumferential part at which cutting fluid for the machining step of the printed circuit board 10a tends to adhere and remain. In addition, the dummy components D15 to D17 are arranged in a region on a forward side of a fan 15 dealing with the flowpath of airflow of the fan 15, as is easily understood by referencing together with FIG. 11A and FIG. 11B. For the dummy components D1 to D17 disposed in this way, deterioration tends to advance compared to the functional elements installed for the original purpose on the main printed circuit board 10. Therefore, by detecting deterioration related to the dummy components D1 to D17, the extent of deterioration is presumed for the functional elements installed for the original purpose on the main printed circuit board 10.

Figure 12:
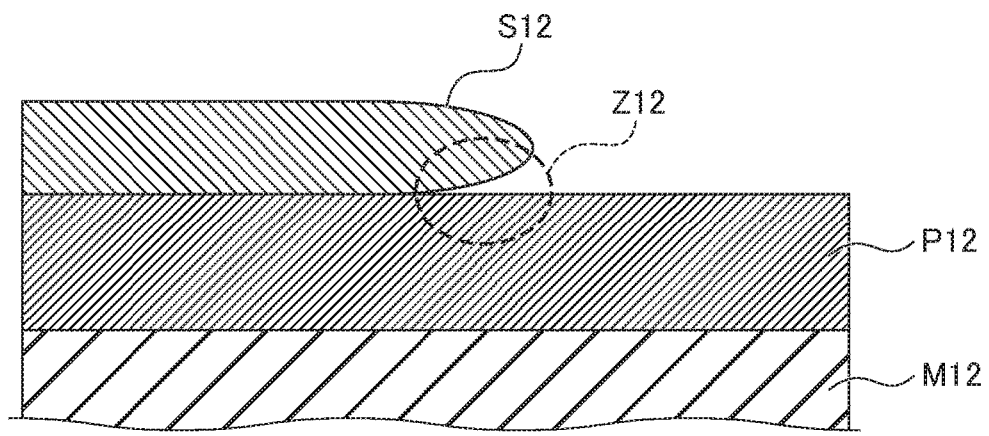
FIG. 12 is a cross-sectional view showing a first deterioration progression pattern applied to the deterioration detection wiring boards of FIGS. 1 to 10B.

Next, the first to sixth deterioration promotion patterns applied to the deterioration detection wiring boards in FIGS. 1 to 10B will be respectively explained by referencing FIGS. 12 to 17 in order. FIG. 12 is a cross-sectional view showing a first deterioration promotion pattern applied to the aforementioned deterioration detection wiring board. In FIG. 12, the conductor pattern P12 which is the wiring pattern formed on the insulated base material M12 constituting the insulated substrate of the printed circuit board is coated by solder resist S12. For such a conductor pattern P12, the solder resist S12 is partially peeled off so that deterioration is promoted in particular. Alternatively, the solder resist S12 is locally provided so that the conductor pattern P12 is partially exposed from the beginning. At a resist interface Z12 at which the solder resist S12 retreats from the partial region of the conductor pattern P12 surface as mentioned above, including a region of the edge part of the solder resist S12 at which a gap from the surface of the conductor pattern P12 surface can form, deterioration such as corrosion and electrolytic corrosion of the conductor pattern P12 is promoted. In other words, the function of deterioration detection will exhibit a favorable characteristic.

Figure 13:
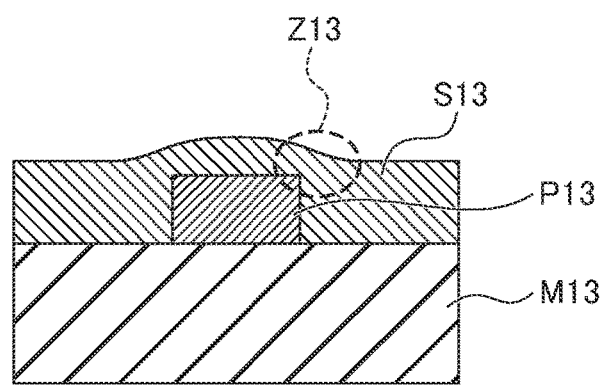
FIG. 13 is a cross-sectional view showing a second deterioration progression pattern applied to the deterioration detection wiring boards of FIGS. 1 to 10B.

Next, FIG. 13 is a cross-sectional view showing a second deterioration promotion pattern applied to the aforementioned deterioration detection wiring board. In FIG. 13, a conductor pattern P13 which is a wiring pattern formed on the insulated base material M13 is coated by solder resist S13. In this case in particular, the thickness of the solder resist S13 becomes relatively thin at a shoulder vicinity region Z13 of the conductor pattern P13, and deterioration such as corrosion and electrolytic correction are promoted in particular. Therefore, the function of deterioration detection will exhibit a favorable characteristic.

Figure 14:
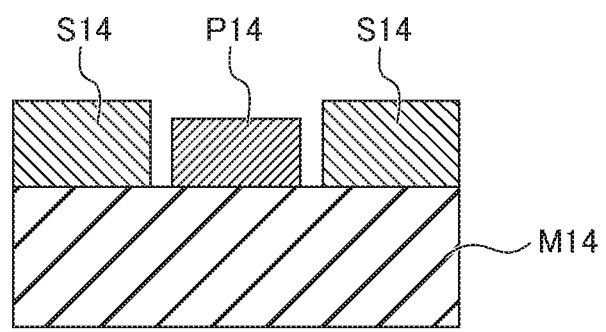
FIG. 14 is a cross-sectional view showing a third deterioration progression pattern applied to the deterioration detection wiring boards of FIGS. 1 to 10B.

Next, FIG. 14 is a cross-sectional view showing a third deterioration promotion pattern applied to the aforementioned deterioration detection wiring board. In FIG. 14, a conductor pattern P14 which is a specific wiring pattern on the insulated base material M14 is not coated by solder resist S14 and thus exposed. For such a conductor pattern P14, deterioration is particularly promoted, and the function of deterioration detection will exhibit a favorable characteristic.

Figure 15:
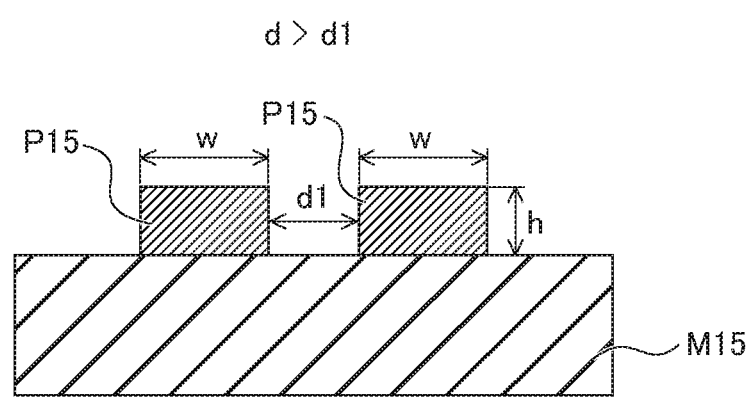
FIG. 15 is a cross-sectional view showing a fourth deterioration progression pattern applied to the deterioration detection wiring boards of FIGS. 1 to 10B.

Next, FIG. 15 is a cross-sectional view showing a fourth deterioration promotion pattern applied to the aforementioned deterioration detection wiring board. In FIG. 15, two conductor patterns P15, P15 are representatively expressed among a plurality of wiring patterns formed on the insulated base material M15. The conductor patterns P15, P15 are formed so that the interval d1 between adjacent ones becomes smaller compared to a standard interval d for the wiring pattern of the aforementioned main printed circuit board 10. Therefore, between the adjacent conductor patterns P15, P15, the insulation degradation is promoted more than the wiring pattern of the main printed circuit board 10. In other words, the function of deterioration detection will exhibit a favorable characteristic.

Figure 16:
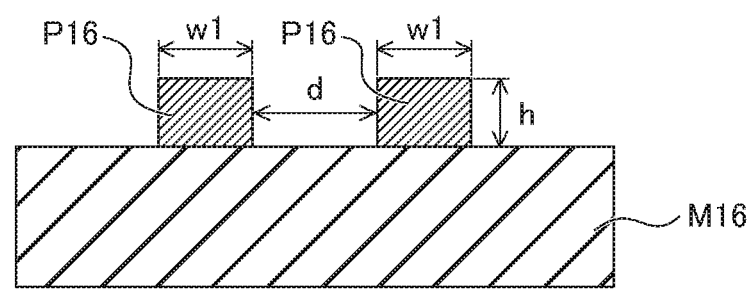
FIG. 16 is a cross-sectional view showing a fifth deterioration progression pattern applied to the deterioration detection wiring boards of FIGS. 1 to 10B.

Next, FIG. 16 is a cross-sectional view showing a fifth deterioration promotion pattern applied to the aforementioned deterioration detection wiring board. In FIG. 16, two conductor patterns P16, P16 are representatively expressed among a plurality of wiring patterns formed on the insulated base material M16. The conductor patterns P16, P16 are formed so that a width w1 of these becomes smaller compared to a standard width w for the wiring pattern of the aforementioned main printed circuit board 10. Therefore, at the conductor patterns P16, P16, deterioration such as corrosion and electrolytic corrosion is promoted more than for the wiring pattern of the main printed circuit board 10. In other words, the function of deterioration detection will exhibit a favorable characteristic.

Figure 17:
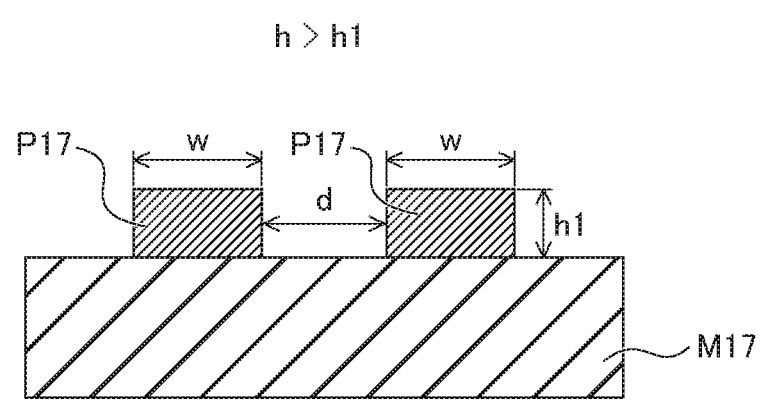
FIG. 17 is a cross-sectional view showing a sixth deterioration progression pattern applied to the deterioration detection wiring boards of FIGS. 1 to 10B.

Next, FIG. 17 is a cross-sectional view showing a sixth deterioration promotion pattern applied to the aforementioned deterioration detection wiring board. In FIG. 17, two conductor patterns P17, P17 are representatively expressed among a plurality of wiring patterns formed on the insulated base material M17. The conductor patterns P17, P17 are formed so that the thickness dimension hi of these becomes smaller compared to a standard thickness dimension h for the wiring pattern of the aforementioned main printed circuit board 10. Therefore, at the conductor patterns P17, P17, deterioration such as corrosion and electrolytic corrosion is promoted more than for the wiring pattern of the main printed circuit board 10. In other words, the function of deterioration detection will exhibit a favorable characteristic.

The first to sixth deterioration promotion patterns applied to the deterioration detection wiring board explained above by referencing FIGS. 12 to 17 in order can apply these deterioration promotion patterns individually to the deterioration detection wiring board, as well as being able to apply by combining two or more thereof as appropriate. For example, it may be applied to the deterioration detection wiring board by combining any one or two, or alternatively all (three) of the fourth to sixth patterns of FIGS. 15 to 17 with the second pattern of FIG. 13 or the third pattern of FIG. 14. However, a combination of the first pattern of FIG. 12 and the second pattern of FIG. 13, and a combination of the second pattern of FIG. 13 and the third pattern of FIG. 14 are not possible due to a conflict arising.

Figure 18:
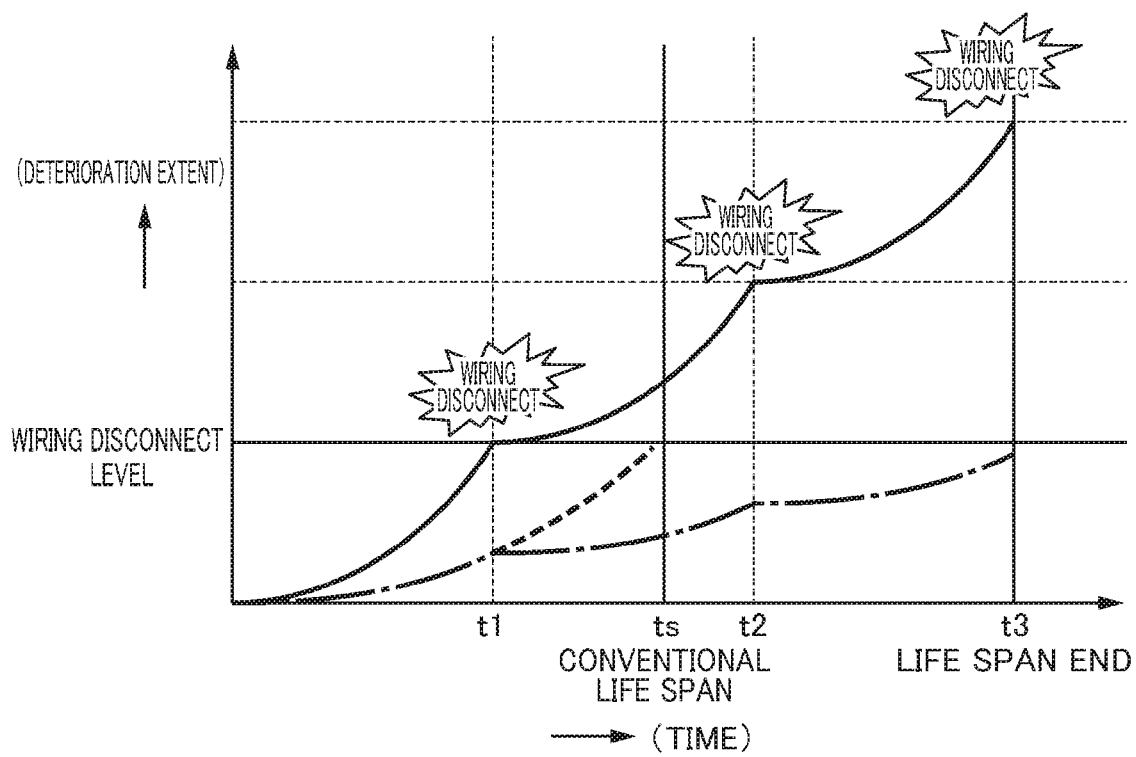
FIG. 18 is a graph showing the characteristic of the service life of a printed circuit board.

FIG. 18 is a graph showing the characteristics of the service life of a printed circuit board. In detail, it is a view conceptually showing an aspect of the life extension of the printed circuit board according to the present invention, in which the horizontal axis represents the useful life (time), and the vertical axis represents the extent of deterioration. In addition, the curved line shown by the solid line represents the deterioration extent of the deterioration detection wiring board 20 (deterioration detection wiring pattern 25 thereof), the curved line shown by the dotted line represents the deterioration extent of the printed circuit board in the case of not conducting special maintenance, and the curved line shown by the dot-dash line represents the deterioration extent of the printed circuit board in the case of conducting maintenance according to deterioration presumed of the printed circuit board of the present invention. Although deterioration of the main printed circuit board 10 progresses as shown by the dot-dash line according to aging deterioration, the deterioration of the deterioration detection wiring board 20 progresses as in the curved line shown by the solid line in advance thereto. The deterioration of the deterioration detection wiring board 20 advances first, and when arriving at a defect such as wiring disconnect occurring in the deterioration detection wiring pattern 25 thereof (time t1 at which "wiring disconnect" first occurs in illustration), it is presumed that deterioration of the main printed circuit board 10 has progressed to an extent requiring maintenance. At this time, refreshing such as performing cleaning on the main printed circuit board 10 is conducted, as well as conducting maintenance like replacing the deterioration detection wiring board 20 in which a defect occurred with a new one. In the embodiment of the present invention, replacement of the deterioration detection wiring board 20 is very easy, as exemplified in FIGS. 2, 3 and 4.

In a conventional case of not performing the aforementioned maintenance, the deterioration of the main printed circuit board 10 progresses as in the curved line of the dotted line, and the life span is exhausted at time ts when reaching wiring disconnect that occurs in the circuit. In contrast, in the case of the present invention, since it is possible to conduct the aforementioned maintenance at time t1, the main printed circuit board 10 is once refreshed, and the progression of deterioration is drastically suppressed as shown by the dot-dash line. On the other hand, in the maintenance at time t1, the deterioration of the deterioration detection wiring board 20 newly replaced progresses similarly to the time period from the calculation start point in time until reaching time t1. When the same extent of time as the above-mentioned period of time further elapses and reaches time t2, it arrives at the aforementioned defect such as wiring disconnect occurring in the deterioration detection wiring pattern 25 of the deterioration detection wiring board 20. At this time t2, maintenance similar to at time t1 is conducted. In other words, the main printed circuit board 10 is refreshed by washing, and the deterioration detection wiring board 20 is replaced. The deterioration of the main printed circuit board 10 thereby comes to exhibit a suppression tendency.

The time period from the calculation start point in time until reaching time t1, and when the deterioration progresses similarly to the time period until reaching time t2 and reaches time t3, it is determined that the life span of the printed circuit board 10 is first exhausted herein. In other words, in the case of the present example, the deterioration detection wiring board 20 is successively replaced in response to aging deterioration, and it is determined that the useful life of the main printed circuit board 10 has ended at time t3 at which a defect such as wiring disconnect occurs in the deterioration detection wiring board 20 for the third board. As a result thereof, according to the present invention, the effective useful lifespan of the main printed circuit board 10 is drastically extended compared to the conventional case (ts), and it is possible to realize a printed circuit board that can reduce costs.

The operational effects of the printed circuit board as an embodiment of the present invention explained above by referencing the drawings will be summarized next.

(1) The printed circuit board 1 as an embodiment of the present invention includes the main printed circuit board 10 in which a wiring pattern is formed on the insulated substrate 11, and the deterioration detection wiring board 20 in which a deterioration detection wiring pattern 25, which is wiring having a form for which deterioration is promoted compared to the wiring pattern of the insulated substrate 11, is formed on a separate insulated substrate 21 from the main printed circuit board 10, and is exchangeably connected to the main printed circuit board 10 by way of the replacement-enabling connection part 30 to the vicinity thereof.

In the printed circuit board 1 of the above (1), failures such as wiring disconnect and insulation failure occurring in the main printed circuit board 10 are presumed according to failures such as wiring disconnect and insulation failure occurring in the deterioration detection wiring board 20 for which the progression of deterioration is faster than the main printed circuit board 10. By conducting a refresh process such as washing on the main printed circuit board 10, as well as conducting the appropriate maintenance such as replacing the deterioration detection wiring board 20 according to this presumption, it is possible to decrease the deterioration thereof.

(2) In one mode of the above-mentioned printed circuit board 1, the replacement-enabling connection part 30 is a solder joint 31 constituted by solder.

In the printed circuit board 1 of the above (2), since the replacement-enabling connection part 30 is the solder joint 31 constituted by solder, it is very easily possible to replace the deterioration detection wiring board 20.

(3) In one mode of the above-mentioned printed circuit board 1, the replacement-enabling connection part 30 is the conductive adhesive connection part 32 constituted by conductive adhesive.

In the printed circuit board 1 of the above (3), since the replacement-enabling connection part 30 is the conductive adhesive connection part 32 constituted by conductive adhesive, it is very easily possible to replace the deterioration detection wiring board 20.

(4) In one mode of the above-mentioned printed circuit board 1, the replacement-enabling connection part 30 is constituted by the cable 33.

In the printed circuit board 1 of the above (4), since the replacement-enabling connection part 30 is constituted by the cable 33, it is very easily possible to replace the deterioration detection wiring board 20.

(5) In one mode of the above-mentioned printed circuit board 1, the replacement-enabling connection part 30 is constituted by a latch-type fitting component such as a connector.

In the printed circuit board 1 of the above (5), since the replacement-enabling connection part 30 is constituted by the latch-type fitting component such as a connector, it especially excels in the ease of replacement of the deterioration detection wiring board 20. Summarizing the above, it is possible to easily replace only the deterioration detection wiring board 20 in the printed circuit board 1 of the present invention, and it is possible to realize the printed circuit board 1 which can reduce costs.

It should be noted that the present invention is not to be limited to the aforementioned embodiments, and that it can be implemented by various modifications and changes. For example, although an example is given in which the deterioration detection wiring board is arranged at a proximate position adjacent to the main printed circuit board by the replacement-enabling connection part, the arrangement of the deterioration detection wiring board is not limited thereto. In other words, it may be installed at a location at which the deterioration action is exerted on the wiring pattern, such as the housing of the main printed circuit board or the fan 15 (FIG. 11A).

In addition, in the aforementioned embodiments of FIGS. 5, 6, 7, 8 and 9, although the deterioration detection wiring pattern 25 is provided to a principal surface on the opposing face side to the printed circuit board 1 of the deterioration detection wiring board 20, this may be provided to the principal surface on the opposite side to the above-mentioned opposing face side to the printed circuit board 1, and further may be configured so as to be provided on both principal surfaces. In the case of providing the deterioration detection wiring pattern 25 to the principal surface on a side not opposing the printed circuit board 1, it may be configured so as to apply a pad-on-through via, and facilitate the connection between the deterioration detection wiring pattern 25 of the deterioration detection wiring board 20 and the conductor on the printed circuit board 1 so that miniaturization can be achieved. Additionally, modifications and improvements within a scope that can achieve the objects of the present invention are also encompassed by the present invention.

CROSS-REFERENCE TO RELATED APPLICATIONS

1 printed circuit board
10 main printed circuit board
11 insulated substrate
20 deterioration detection wiring board
30 replacement-enabling connection part
31 solder joint
32 conductive adhesive connection part
33 cable

What is claimed is:

1. A printed circuit board comprising:
a main printed circuit board in which a wiring pattern is formed on an insulated substrate;
a deterioration detection wiring board in which deterioration detection wiring which is wiring having a form whereby deterioration is promoted compared to the wiring pattern is formed on a separate insulated substrate from the main printed circuit board, and is exchangeably connected to the main printed circuit board in a vicinity thereof by way of a replacement-enabling connection part;
a plurality of pad parts formed on the separate insulated substrate, each one of the plurality of pad parts positioned separately from other pad parts of the plurality of pad parts by a distance;
a deterioration detection wiring pattern formed on the separate insulated substrate, the deterioration detection wiring pattern positioned to connect a first pad part of the plurality of pad parts to a second pad part of the plurality of pad parts; and
a solder resist, the solder resist positioned to cover each one of the plurality of pad parts and positioned to partially cover the deterioration detection wiring pattern to form an interrupted coverage of the solder resist at a plurality of locations such that the deterioration detection wiring pattern is exposed to air at the plurality of locations between the first pad part and the second pad part.

2. The printed circuit board according to claim 1, wherein the replacement-enabling connection part is a connection part configured by solder.

3. The printed circuit board according to claim 1, wherein the replacement-enabling connection part is a connection part configured by an electrically conductive adhesive.

4. The printed circuit board according to claim 1, wherein the replacement-enabling connection part is a connection part configured by a cable.

5. The printed circuit board according to claim 1, wherein the replacement-enabling connection part is a connection part configured by a connector.

6. A printed circuit board comprising:
a main printed circuit board in which a wiring pattern is formed on an insulated substrate; and
a deterioration detection wiring board in which deterioration detection wiring which is wiring having a form whereby deterioration is promoted compared to the wiring pattern is formed on a separate insulated substrate from the main printed circuit board, and is exchangeably connected to the main printed circuit board in a vicinity thereof by way of a replacement-enabling connection part, wherein the deterioration detection wiring is uncovered with a solder resist and formed so that an interval between adjacent conductor patterns of the deterioration detection wiring is smaller than a standard interval for the wiring pattern of the main printed circuit board.

7. The printed circuit board according to claim 6, wherein the replacement-enabling connection part is a connection part configured by solder.

8. The printed circuit board according to claim 6, wherein the replacement-enabling connection part is a connection part configured by an electrically conductive adhesive.

9. The printed circuit board according to claim 6, wherein the replacement-enabling connection part is a connection part configured by a cable.

10. The printed circuit board according to claim 6, wherein the replacement-enabling connection part is a connection part configured by a connector.

11. A printed circuit board comprising:
a main printed circuit board in which a wiring pattern is formed on an insulated substrate; and
a deterioration detection wiring board in which deterioration detection wiring, which is wiring having a form whereby deterioration is promoted compared to the wiring pattern, is formed on a separate insulated substrate from the main printed circuit board, and is exchangeably connected to the main printed circuit board in a vicinity thereof by way of a replacement-enabling connection part,
wherein the deterioration detection wiring is uncovered by a solder resist and formed so that a width of the uncovered conductor patterns of the deterioration detection wiring becomes smaller compared to a standard width for the wiring pattern of the main printed circuit board.

12. The printed circuit board according to claim 11, wherein the replacement-enabling connection part is a connection part configured by solder.

13. The printed circuit board according to claim 11, wherein the replacement-enabling connection part is a connection part configured by an electrically conductive adhesive.

14. The printed circuit board according to claim 11, wherein the replacement-enabling connection part is a connection part configured by a cable.

15. The printed circuit board according to claim 11, wherein the replacement-enabling connection part is a connection part configured by a connector.

16. A printed circuit board comprising:
a main printed circuit board in which a wiring pattern is formed on an insulated substrate; and
a deterioration detection wiring board in which deterioration detection wiring, which is wiring having a form whereby deterioration is promoted compared to the wiring pattern, is formed on a separate insulated substrate from the main printed circuit board, and is exchangeably connected to the main printed circuit board in a vicinity thereof by way of a replacement-enabling connection part,
wherein the deterioration detection wiring is uncovered with a solder resist and formed so that a thickness dimension of uncovered conductor patterns of the deterioration detection wiring becomes smaller compared to a standard thickness dimension for the wiring pattern of the main printed circuit board.

17. The printed circuit board according to claim 16, wherein the replacement-enabling connection part is a connection part configured by solder.

18. The printed circuit board according to claim 16, wherein the replacement-enabling connection part is a connection part configured by an electrically conductive adhesive.

19. The printed circuit board according to claim 16, wherein the replacement-enabling connection part is a connection part configured by a cable.

20. The printed circuit board according to claim 16, wherein the replacement-enabling connection part is a connection part configured by a connector.

21. A printed circuit board comprising:
a main printed circuit board in which a wiring pattern is formed on an insulated substrate;
a deterioration detection wiring board in which deterioration detection wiring which is wiring having a form whereby deterioration is promoted compared to the wiring pattern is formed on a separate insulated substrate from the main printed circuit board, and is exchangeably connected to the main printed circuit board in a vicinity thereof by way of a replacement-enabling connection part;
a plurality of pad parts formed on the separate insulated substrate, each one of the plurality of pad parts positioned separately from other pad parts of the plurality of pad parts by a distance;
a deterioration detection wiring pattern formed on the separate insulated substrate, the deterioration detection wiring pattern positioned to connect a first pad part of the plurality of pad parts to a second pad part of the plurality of pad parts, the deterioration detection wiring pattern includes a pad exposed to air that is wider than conductors that connect the exposed pad to the first pad and to the second pad.

22. The printed circuit board according to claim 21, wherein the replacement-enabling connection part is a connection part configured by solder.

23. The printed circuit board according to claim 21, wherein the replacement-enabling connection part is a connection part configured by an electrically conductive adhesive.

24. The printed circuit board according to claim 21, wherein the replacement-enabling connection part is a connection part configured by a cable.

25. The printed circuit board according to claim 21, wherein the replacement-enabling connection part is a connection part configured by a connector.

* * * * *